United States Patent [19]
Nakato

[11] Patent Number: 5,514,897
[45] Date of Patent: May 7, 1996

[54] GRADED IMPLANTATION OF OXYGEN AND/OR NITROGEN CONSTITUENTS TO DEFINE BURIED ISOLATION REGION IN SEMICONDUCTOR DEVICES

[75] Inventor: Tatsuo Nakato, Vancouver, Wash.

[73] Assignees: Sharp Microelectronics Technology, Inc., Camas, Wash.; Sharp Kabushiki Kaisha, Osaka, Japan

[21] Appl. No.: 337,280

[22] Filed: Nov. 10, 1994

Related U.S. Application Data

[62] Division of Ser. No. 232,880, Apr. 25, 1994, Pat. No. 5,395,771, which is a continuation of Ser. No. 861,141, Mar. 31, 1992, abandoned.

[51] Int. Cl.$^6$ .......................... H01L 27/01; H01L 21/76; H01L 21/265
[52] U.S. Cl. .......................... 257/396; 257/611; 257/617; 257/639; 257/649
[58] Field of Search .................. 257/347, 352, 257/353, 395, 396, 506, 507, 610, 611, 612, 617, 635, 639, 640, 647, 649

[56] References Cited

U.S. PATENT DOCUMENTS

| | | | |
|---|---|---|---|
| 4,510,671 | 4/1985 | Kurtz et al. | 257/419 |
| 4,749,660 | 6/1988 | Short et al. | 257/347 |

*Primary Examiner*—Sara W. Crane
*Assistant Examiner*—Alice W. Tang
*Attorney, Agent, or Firm*—Fliesler, Dubb, Meyer & Lovejoy

[57] ABSTRACT

A graduated concentration profile is used for defining a buried isolation region in a semiconductor device. Smaller concentrations of dielectric-defining particles are used for implantation at the deepest levels of the isolation region in order to reduce the defect density in an overlying epi layer.

13 Claims, 3 Drawing Sheets

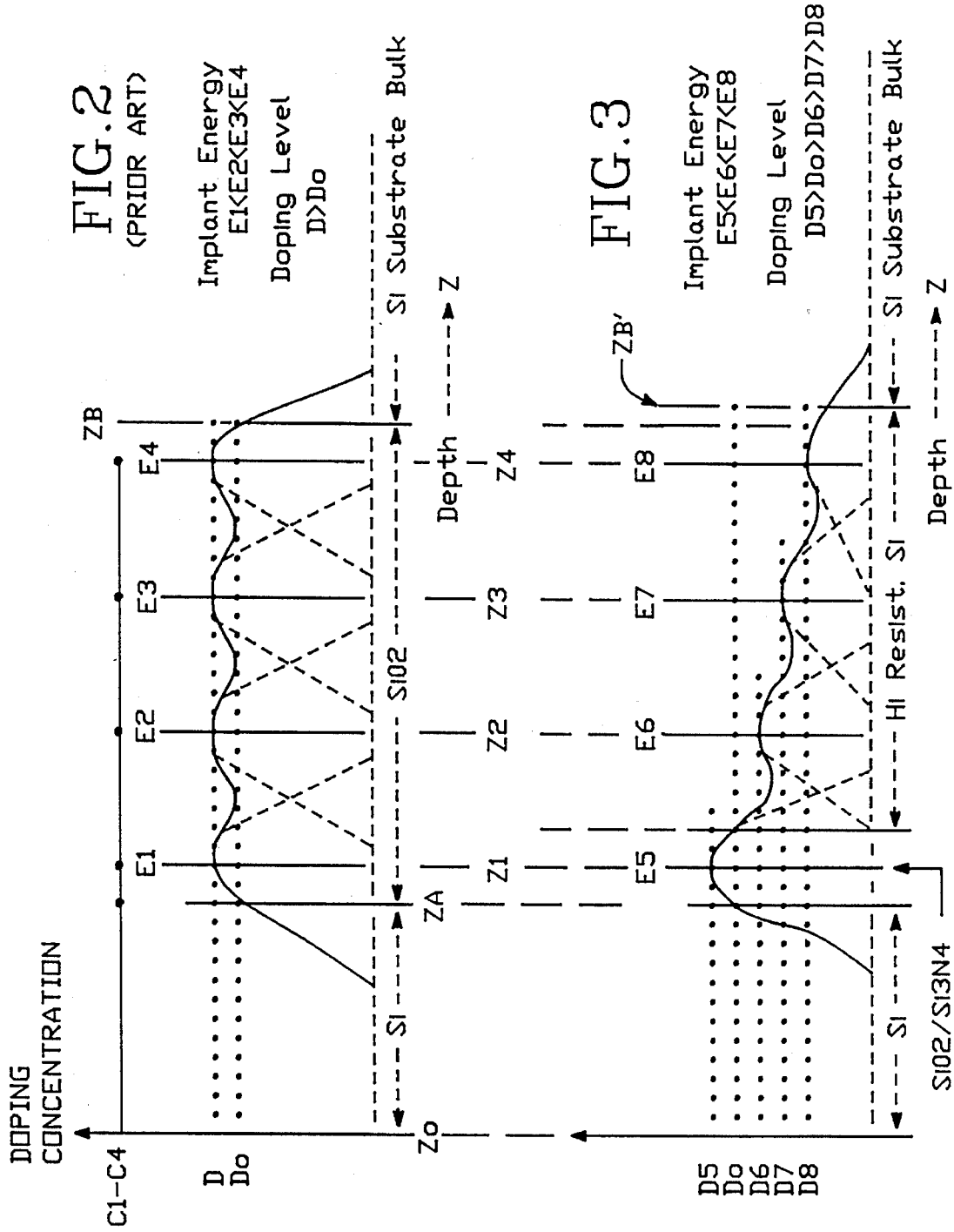

GRADED IMPLANTATION OF OXYGEN AND/OR NITROGEN CONSTITUENTS TO DEFINE BURIED ISOLATION REGION IN SEMICONDUCTOR DEVICES

This application is a divisional of Ser. No. 08/232,880 filed Apr. 25, 1994, now U.S. Pat. No. 5,395,771, which is a continuation of Ser. No. 07/861,141, filed Mar. 31, 1992, now abandoned.

BACKGROUND OF THE INVENTION

1. Field of the Invention

The invention is generally directed to semiconductor fabrication. The invention is more specifically directed to the formation of a buried isolation region using implantation of oxygen, nitrogen or other insulation-forming particles into a single crystal semiconductor substrate.

2. Description of the Related Art

It is sometimes desirable, in the fabrication of integrated circuit (IC) devices, to define an insulator region buried deep within a semiconductor substrate. The insulator region provides electrical isolation between a top portion of the substrate (epi region) and a deeper portion of the substrate (bulk region).

The term "electrical isolation" is used here to mean that one or more of the following conditions are met: (a) a relatively high resistance separates the epi region electrically from the bulk region; (b) a relatively small capacitance separates the epi region electrically from the bulk region; and (c) the electrical separation of the epi region from the bulk region is able to withstand high voltages without breakdown. Resistance is maximized, capacitance is minimized and breakdown voltage is maximized by providing a relatively thick insulator region of homogenous high resistivity and homogenous low dielectric constant between parts of the substrate that are to be isolated from one another.

Traditional isolation techniques create a homogenous high doping concentration of insulative molecules within the substrate. In a silicon (Si) substrate for example, a concentration of approximately $2 \times 10^{18}$ atoms/cm$^2$ of oxygen is provided uniformly across a buried insulator region of one-half micron (0.5 μm) or greater thickness. High energy implantation is used to introduce oxygen atoms into a subsurface region of a semiconductor substrate. When the substrate is monocrystalline silicon, the silicon atoms combine with the implanted O atoms to produce $SiO_2$.

Implantation of the oxygen atoms initially produces a very thin region (e.g., 0.1 μm or less) of extremely high concentration. Post-implant heat treatment diffuses the implanted particles over a broader region (0.5 μm). The resultant concentration of insulation-forming particles then assumes a Gaussian-like (bell-shaped) distribution relative to the initial implant depth.

Practitioners conventionally implant equal concentrations of oxygen atoms at a series of equally-spaced levels below the substrate surface in order to create a thick homogenous insulator region. During post-implant heat treatment, the Gaussian diffusion distributions of the multiple implants overlap to produce a nearly homogenous concentration of insulation-forming atoms.

There is a drawback to this method, however. Each high-energy implantation disadvantageously creates defects in the crystal structure of the region through which it passes. The number of defects tends to increase as the concentration of implant atoms increases. The number of defects also tends to increase as the implant energies increase.

When buried insulator regions of homogenous composition are produced within a semiconductor device by way of high energy implantation, the deepest implant causes the most damage to the crystal structure of the overlying epi region. Progressively less but nonetheless cumulative damage is produced by the high energy implantation of atoms into progressively shallower depths.

The resultant damage to the crystal structure of the epi layer can interfere with the operability of electronic circuits that are defined in the epi region either at later or earlier times. Production yields can become unacceptably low. The cost of fabricating circuits with implant-defined insulator regions then becomes unattractively high.

A need exists in the industry for a high yield fabrication method that can provide electrical isolation by way of high energy implantation.

SUMMARY OF THE INVENTION

In accordance with the invention, plural implantations of insulation-forming and/or dielectric-forming particles are provided but the implantation concentrations are graduated such that deeper implantations are of a substantially lower concentration and shallower implantations are by comparison of a substantially higher concentration. The result is less damage to the overlying semiconductor region through which the implanted particles pass.

BRIEF DESCRIPTION OF THE DRAWINGS

The invention will be described with reference to the following drawings in which:

FIG. 2 is a plot showing conventional concentration distribution of particles used for forming the isolation region.

FIG. 3 is a plot showing a sample concentration distribution of particles used for forming a buried dielectric region in accordance with the invention.

DETAILED DESCRIPTION

Figure 1:
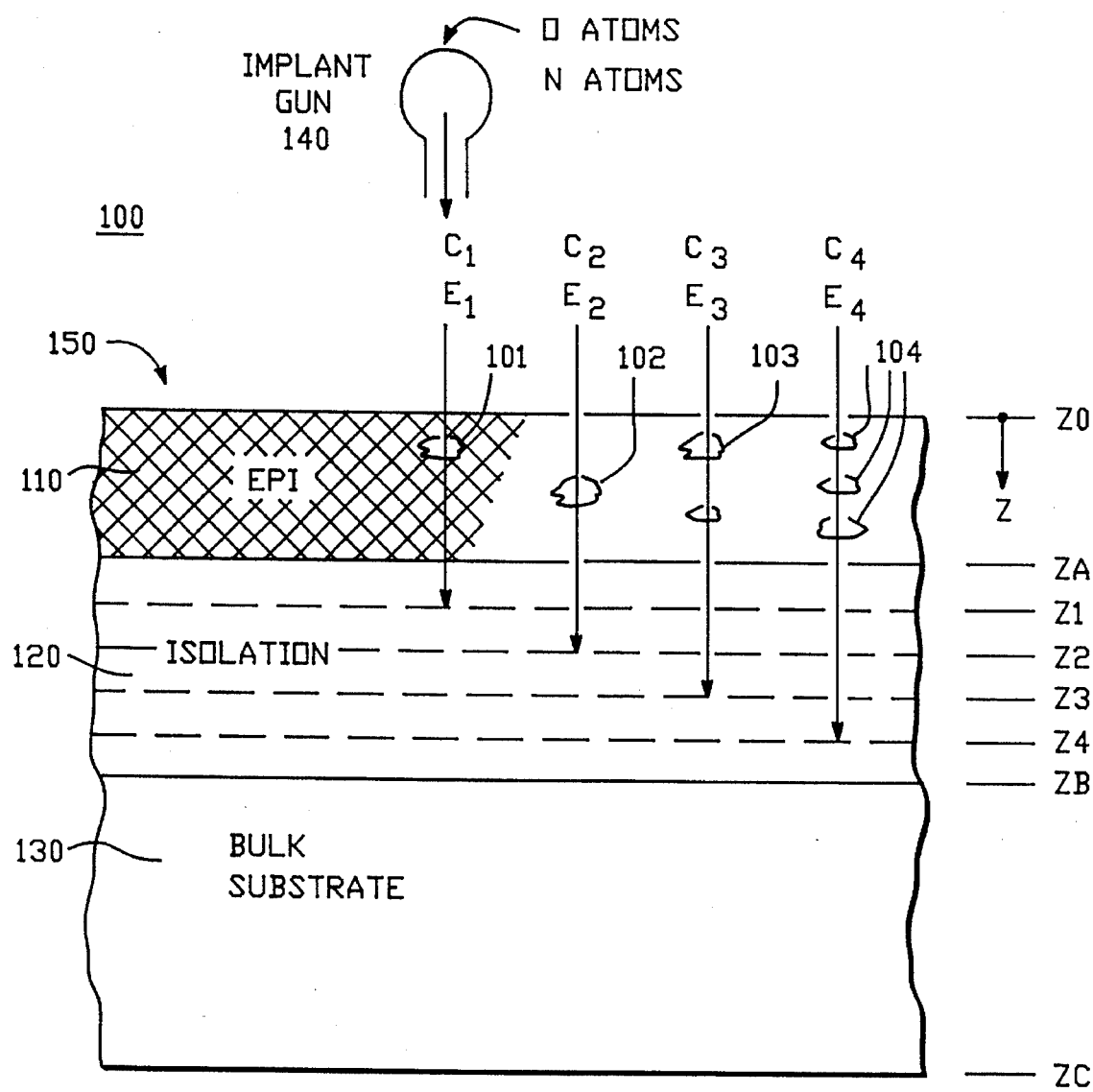
FIG. 1 is a cross-sectional view of a semiconductor substrate having an isolation region defined between an epi layer and a bulk layer.

FIG. 1 shows a fabrication environment 100 in which an ion or other particle implant gun 140 fires concentrations C1, C2, C3, C4 of oxygen and/or nitrogen atoms at respective energy levels E1, E2, E3, E4 into a semiconductor substrate 150 in order to define an isolation region 120 within the semiconductor substrate 150. Depth is measured downwardly from the top surface of substrate 150 towards a bulk portion 130 of the substrate (along the Z direction). The top surface of substrate 150 is referenced as level Z0.

Initially, substrate 150 is composed of monocrystalline silicon. The crystal structure is preferably homogenous and defect-free.

At a first time point ($t_1$), a high concentration C1 of oxygen and/or nitrogen atoms is fired using a first energy, E1, from implant gun 140 through the top surface Z0 of the substrate to a level Z1 below the substrate surface. This step is followed by high temperature annealing.

At a second time ($t_2$), another high concentration C2 of oxygen and/or nitrogen atoms is fired at higher energy level E2 (E2>E1) to a deeper level Z2 of the substrate (Z2>Z1). High temperature annealing follows. The process repeats with higher energy level E3 (E3>E2) being used to implant concentration C3 of O and/or N atoms to yet a deeper level Z3 (Z3>Z2) and another annealing step follows. Even higher energy E4 (E4>E3) is used to drive concentration C4 of dopants to yet deeper level Z4 (Z4>Z3) and yet a further annealing step follows.

The end result is the formation of a buried isolation region 120 which is composed of $SiO_2$, or $Si_3N_4$, or a mixture of these compounds, or a composition of the general form $Si_aO_bN_c$ (where a>0 and a+b+c=100%). The isolation region begins at depth ZA and ends at depth ZB where Z0<ZA<Z1<Z4<ZB<ZC. ZC is a level deep within the bulk region 130 of the substrate.

FIG. 2 is a plot of the resulting concentration (atoms/cm³) of insulation-forming particles (oxygen atoms) after a conventional implant technique is used. A relatively stoichiometric concentration in the concentration of oxygen atoms in the concentration range D–D0 develops between depths ZA and ZB as a result of high temperature diffusion. Implant concentrations C1 through C4 are all the same. The post-anneal peak concentration, D, at each of the implant levels, Z1–Z4, is less than C1–C4. Overlapping diffusion gradients, centered at respective levels Z1, Z2, Z3 and Z4, produce the final generally stoichiometric distribution of $SiO_2$ molecules in region ZA–ZB. In one example, the peak concentration D, is $5 \times 10^{22}$ atoms/cm³ of O atoms, the minimum concentration, $D_0$, is $4.6 \times 10^{22}$ atoms/cm³ and energies E1, E2, E3, E4, are respectively, 20 KeV, 25 KeV, 30 KeV and 35 KeV. The corresponding depths are ZA=375 Å, Z1=500 Å, Z2=625 Å, Z3=750 Å, Z4=875 Å and ZB=1000 Å. The concentration of the implant atoms is sufficient to define a resistivity of at least $10^9$ ohm.cm and a relative dielectric constant less than that of Si, e.g., no more than 10 throughout region 120. In such a case isolation region 120 can be said to consist essentially of $SiO_2$ with no or relatively few Si atoms being left in region 120 that are not bound to an O atom.

Referring back to FIG. 1, the region 110 between levels Z0 and ZA is referred to as the epi layer 110. For the uniform concentration distribution condition depicted by FIG. 2, the region 120 between levels ZA and ZB is referred to as a buried isolation layer 120. The region below ZB is referred to as the bulk substrate region 130.

The cross hatching in epi layer 110 is meant to indicate that the monocrystalline structure of this layer 110 plays an important role in subsequent (or prior) fabrication steps. Conductivity-defining dopants such as arsenic and phosphorous are introduced into epi layer 110 at other fabrication steps to create transistors, diodes and other electronic components.

High energy implantation tends to produce defects in the crystal structure of epi layer 110. If enough defects (e.g., 101) develop in the epi layer 110, such defects can interfere with the proper operation of electronic components defined in epi layer 110. If the number of crystal defects is too large, such as $10^5$/cm² or more, and/or the length of the defects is too large, such as a few micrometers each or longer, the electronic circuitry (not shown) of the epi layer 110 may be rendered inoperative in some cases, and as a result, mass production yields can become relatively low. This is undesirable because the cost of fabricating operative devices then becomes quite high.

The first implantation (C1,E1) tends to produce a relatively small number and/or size of defects 101 in epi layer 110. The second, more energetic implantation (C2,E2) tends to produce more and/or larger defects 102 in the epi layer. Similarly, third implantation (C3,E3) tends to produce even more and/or larger defects 103, and fourth implantation (C4,E4) tends to produce yet more and/or larger defects 104. Post-implantation annealing heals some, but not all defects. Generally speaking, the final defect count in the epi layer may be expressed as a cumulative function of the implant energy multiplied by the implant concentration used in each implantation. This concept is expressed in the below sum of products equation, Eq. (1):

$$\text{Defect Count} = f_1(C1 \cdot E1) + f_2(C2 \cdot E2) + f_3(C3 \cdot E3) + f_4(C4 \cdot E4) \quad \text{Eq. (1)}$$

The symbol Cn.En represents the product of concentration and energy for each implantation, n=1, 2, 3, ..., etc. The symbol $f_n$ represents a contribution function (e.g., a linear function) of each implant to the overall defect count. Defect count can be expressed as the number of crystal defects having a size equal to or greater than a specified minimum. The minimum size detected by wet etching is usually 0.1 μm. The highest contribution to the epi layer defect count is from the most energetic implantation, $f_4(C4.E4)$, because this implantation uses the highest amount of energy for reaching the deepest level, Z4.

Referring again to FIG. 2, the advantage of providing a stoichiometric distribution of insulative material ($SiO_2$ and/or $Si_3N_4$) between levels ZA and ZB is that room temperature electrical current leakage between epi layer 110 and bulk region 130 can be made relatively small such as $10^{-10}$ ampere/cm², even under high voltage conditions. This is an order of magnitude better than the $10^{-9}$ ampere/cm² leakage obtained with conventional P/N junction isolation. Low leakage current is important in the fabrication of low power memory devices and other low power integrated circuits.

The electrical resistance of isolation region 120 may be generally expressed by the following equation Eq.(2) in the case where its composition is homogeneous.

$$R_{120} = D \cdot (ZB - ZA) \cdot K_2 \qquad \text{Eq.(2)}$$

In above equation Eq.(2), ZB–ZA represents the thickness of the buried isolation region 120 and D approximates the concentration of insulator-forming particles in region 120. $K_2$ is a galvanometric conversion factor for converting between units of resistance and units of particle concentration.

Equation Eq.(2) can be rewritten in the form of the following integration:

$$R_{120} = K_2 \cdot \int_{z=ZA}^{z=ZB} (dD) dZ \qquad \text{Eq. (3)}$$

where dD is the per cm² concentration of insulator-forming particles (O and/or N) distributed at each given depth Z.

For high frequency circuit operation, the capacitive coupling between epi layer 110 and bulk region 130 is also a concern. Capacitance between epi layer 110 and bulk region 130 is a function of the dielectric constant in region 120 and the thickness of region 120. Generally speaking, it may be expressed by the following equation, Eq.(4) in the case where the composition of region 120 is homogeneous.

$$C_{120} = 1/(D \cdot (ZB - ZA)) \cdot K_3 \qquad \text{Eq. (4)}$$

Above equation Eq.(3) assumes a uniform distribution D of insulator material in region 120 as indicated by FIG. 2. $K_3$ is a galvanometric conversion factor for converting between units of capacitance (e.g., farads) and units of reciprocal concentration.

Equation Eq.(4) can be rewritten as the following equation Eq.(5):

$$C_{120} = K_3 / \int_{z=ZA}^{z=ZB} (dD) dZ \qquad \text{Eq. (5)}$$

Intrinsic silicon has a relatively high dielectric constant (approximately 12 relative to fee space), but addition of dielectric-defining particles such as O or N tends to reduce the dielectric constant to a value of 10 or below. The resulting capacitive coupling between region 110 and region 130 is thus reduced.

FIG. 3 is a plot of implanted particle concentration versus depth for a semiconductor device and fabrication method in accordance with the invention. As seen, the implantation concentration decreases significantly as the implantation depth increases. Implant energy E5 (e.g., 20 KeV) is used to create peak concentration D5 at depth Z1, as shown. High temperature annealing follows. In one embodiment, concentration D5 is the same as comparative concentration D of FIG. 2, namely, $5 \times 10^{22}$ atoms/cm$^3$. D5 should be at least as large as D0. D0 is defined as the concentration at which a stoichiometric insulator is formed. For a composition of SiO$_2$, concentration DO is typically $4.6 \times 10^{22}$ atoms of oxygen per cm$^3$. For a composition of Si$_3$N$_4$, concentration DO is typically $3.1 \times 10^{22}$ atoms of nitrogen per cm$^3$.

In another step, implant energy E6 (E6=E2) is used to create a lower peak concentration D6 of dielectric-forming particles at depth Z2 where D6 is substantially less than D0. In one embodiment, D6 is 80% or less of D5, e.g., D6=$4.0 \times 10^{22}$ atoms/cm$^3$. High temperature annealing follows. Similarly, an even smaller peak concentration D7 of dielectric-forming particles is formed at depth Z3 by higher implant energy E7 and yet a lower concentration D8 of dielectric-forming impurities are produced at depth Z4 by yet higher implant energy E8. D7 can be 60% or less of D5 (e.g., D7=$3.0 \times 10^{22}$ atoms/cm$^3$) and D8 can be 40% or less of D5 (e.g., D8=$2.0 \times 10^{22}$ atoms/cm$^3$). Implant E8 is preferably performed first and E5 last so that implant E8 is followed by more high temperature anneals. This can reduce the total number of defects. Effective depth ZB$^1$ can extend slightly below effective depth ZB.

A key advantage of the doping structure shown in FIG. 3 is that the cumulative implant damage to the epi layer 110 is reduced. Current leakage through buried region 120 might be slightly higher under high voltage conditions because the resistance between levels ZA and ZB is smaller, but this disadvantage is offset by significantly improved yield in mass-production situations.

The composition formed between depths ZA and ZB can be generally characterized as Si$_a$O$_b$N$_c$ where composition factors, , "a", "b" and "c" define the atomic sum, d=a+b+c. Factor "a" increases gradually from a level of 20% or greater towards 100% of "d" as one moves from ZA to ZB while b and c decrease. Factor c can be as large as 4/7 of atomic sum d but preferably, factor c should be kept at 50% or less of sum d and more preferably at 2% or less of sum d in region 120. Factor b can be as high as 2/3 of factor d but drops towards 0% as depth increases below level ZB.

Figure 4:
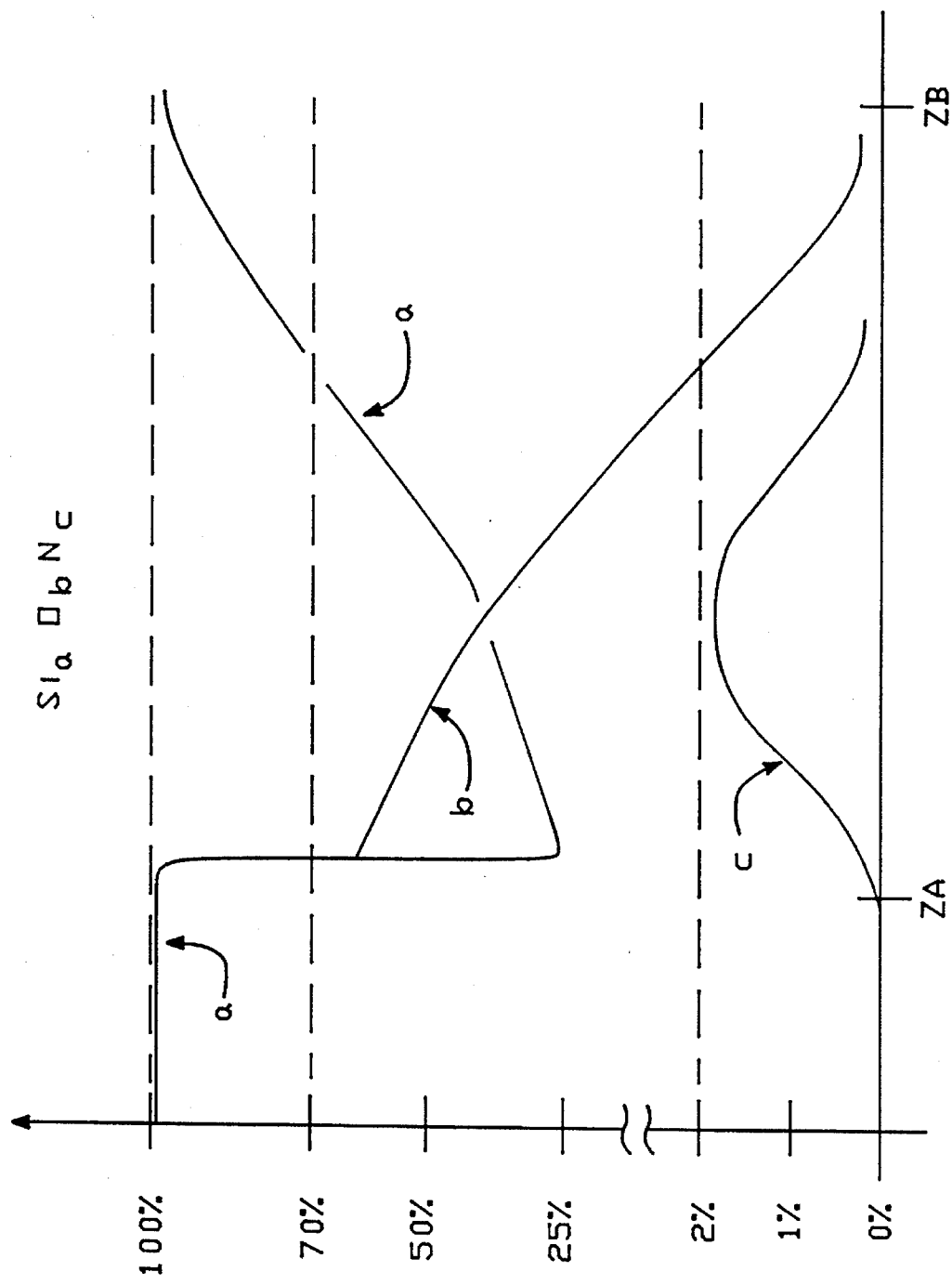
FIG. 4 is a plot showing a sample composition $Si_aO_bN_c$ of low dielectric material which is defined in the buried dielectric region.

FIG. 4 diagrams one possible distribution of factors a, b and c through region 120. Factor c peaks at or below 2% approximately midway between depths ZA and ZB. This is done to minimize dislocation stress within the crystal structure due to insertion of nitrogen atoms. Factor b decreases from approximately 66% to 0% while factor a increases from approximately 34% to 100% as one moves from depth ZA to depth ZB.

Of importance it should be observed that the dielectric constant in isolation region 120 is maintained at a level below that of intrinsic silicon. Capacitive coupling between epi region 110 and bulk region 130 is held to an acceptable low level. At the same time, the number of defects which would otherwise develop in epi region 110 is reduced in comparison to the number which would have formed if implantation sought to produce a homogenous concentration of insulator-forming particles in dielectric region 120. Alternatively, it can be said that for a given, acceptable defect density, one obtains less capacitive coupling between regions 110 and 130 by using the above-described implant profile.

Numerous variations and modifications will become apparent to those skilled in the art after reading the above disclosure. The embodiments disclosed above are meant to be illustrative rather than limiting. The substrate material could include Ge and/or GaAs in addition to or to the exclusion of Si. Dielectric-defining materials in region 120 can include GeO$_2$ or Ge$_a$N$_b$O$_c$ or insulative compounds of GaAs.

What is claimed is:

1. A semiconductor device comprising an epi layer, an isolation region and a bulk layer arranged one below the other in the recited order where the isolation region has a top boarding the epi layer and a bottom boarding the bulk layer and is composed of a semiconductor material and one or more insulation-forming particles and where a concentration of the particles does not approximate a Gaussian distribution of the particles within the isolation region and the concentration of particles decreases substantially from the top of the isolation region to the bottom of the isolation region.

2. The semiconductor device of claim 1 where semiconductor material is Si or Ge and the insulation-forming particles include atoms selected from the group consisting of oxygen (O) and nitrogen (N).

3. The semiconductor device of claim 2 where a composition of the isolation region is defined essentially by Si$_a$O$_b$N$_c$, composition factor c is 50% or less of a sum d where d=a+b+c, composition factor a is greater than 20% of sum d and composition factor b is zero or more.

4. The semiconductor device of claim 3 where composition factor c is 2% or less of the sum, d=a+b+c.

5. The semiconductor device of claim 3 where a concentration of composition portion O$_b$N$_c$ in the isolation region decreases from a value of approximately $3.1 \times 10^{22}$ atoms per cubic centimeter or more near the top of the isolation region to a value of approximately $2.0 \times 10^{22}$ atoms per cubic centimeter or less near the bottom of the isolation region.

6. A semiconductor device comprising:

an epi layer;

a bulk layer; and an isolation region, located between the epi layer and the bulk layer, composed of a semiconductor material and one or more insulation-forming particles and is divided into a first region and a second region where:

the first region is located adjacent to the epi layer and has a concentration of the particles to form a stoichiometric insulator in the first region, and the second region is at least equal in size to the first region, is located adjacent to both the first region and the bulk layer and has a concentration of the particles less than the concentration of particles required to form a stoichiometric insulator.

7. The semiconductor device of claim 6 where semiconductor material is Si or Ge and the insulation-forming particles include atoms selected from the group consisting of oxygen (O) and nitrogen (N).

8. The semiconductor device of claim 7 where a composition of the isolation region is defined by $Si_aO_bN_c$, where the letters a, b and c designate the percentage concentration of each element Si, O and N of the composition at any location within the isolation region meets the criteria of:

100%=a+b+c;

a has a minimum value of 20%, b has a maximum value of 80%, and c has a maximum value of 57.14%.

9. The semiconductor device of claim 8 where c for the element N does not exceed a value of 2%.

10. The semiconductor device of claim 8 where a concentration of $O_bN_c$ of the composition $Si_aO_bN_c$ in the isolation region decreases from a value of approximately $5\times10^{22}$ atoms per cubic centimeter in the first region to a value of approximately $2.0\times10^{22}$ atoms per cubic centimeter in the second region.

11. The semiconductor device of claim 6 wherein the second region of the isolation region further comprises:

a series of subregions where a first subregion in the series of subregions is adjacent to the first region and a last subregion of the series of subregions is adjacent to the bulk layer and where the concentration of the particles in each subregion successively deceases for providing the first subregion with the highest concentration of the particles and the last subregion with the lowest concentration of particles in the series of subregions.

12. The semiconductor device of claim 11 wherein the series of subregions is comprised of a first, second and last subregion.

13. The semiconductor device of claim 12 wherein:

the first region has a maximum concentration of the particles of approximately $5\times10^{22}$ atoms per cubic centimeter;

the first subregion of the second region has a maximum concentration of the particles of approximately $4\times10^{22}$ atoms per cubic centimeter;

the second subregion of the second region has a maximum concentration of the particles of approximately $3\times10^{22}$ atoms per cubic centimeter; and the last subregion of the second region has a maximum concentration of the particles of approximately $2\times10^{22}$ atoms per cubic centimeter.

\* \* \* \* \*